United States Patent
Halbritter et al.

(10) Patent No.: US 9,466,769 B2
(45) Date of Patent: Oct. 11, 2016

(54) METHOD FOR PRODUCING A PLURALITY OF OPTO-ELECTRONIC COMPONENTS AND OPTO-ELECTRONIC COMPONENT

(75) Inventors: Hubert Halbritter, Dietfurt (DE); Heinz Haas, Regensburg (DE); Claus Jaeger, Regensburg (DE); Bernhard Stojetz, Wiesent (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/344,871

(22) PCT Filed: Jul. 30, 2012

(86) PCT No.: PCT/EP2012/064886
§ 371 (c)(1),
(2), (4) Date: Apr. 15, 2014

(87) PCT Pub. No.: WO2013/037556
PCT Pub. Date: Mar. 21, 2013

(65) Prior Publication Data
US 2014/0225147 A1   Aug. 14, 2014

(30) Foreign Application Priority Data
Sep. 13, 2011 (DE) ........................ 10 2011 113 483

(51) Int. Cl.
*H01L 33/48* (2010.01)
*H01L 33/58* (2010.01)
*H01L 25/075* (2006.01)
(Continued)

(52) U.S. Cl.
CPC ............... *H01L 33/48* (2013.01); *H01L 33/58* (2013.01); *F21V 5/007* (2013.01); *F21Y 2105/001* (2013.01); *H01L 25/0753* (2013.01);
(Continued)

(58) Field of Classification Search
CPC . H01L 31/0203; H01L 33/58; H01L 25/167; H01L 31/0232; H01L 25/0753; H01L 33/48; F21V 5/007; F21Y 2105/001
USPC ............. 257/88, 99, 100, E33.057, E33.056, 257/E33.058
See application file for complete search history.

(56) References Cited

U.S. PATENT DOCUMENTS 7,196,756 B2   3/2007   Oda et al.
7,309,855 B2   12/2007  Nagasaka et al.
(Continued)

FOREIGN PATENT DOCUMENTS

CN   1534355 A   10/2004
CN   1661823 A   8/2005
(Continued)

*Primary Examiner* — Latanya N Crawford
(74) *Attorney, Agent, or Firm* — Slater Matsil, LLP

(57) ABSTRACT

A method is provided for producing a plurality of optoelectronic components. A number of semiconductor chips are arranged on a connection carrier assembly. A frame assembly with a number of openings is arranged in such a way, relative to the connection carrier assembly, that the semiconductor chips are each arranged in one of the openings. A number of optical elements are positioned in such a way, relative to the frame assembly, that the optical elements cover the openings. The connection carrier assembly with the frame assembly and the optical elements is singulated into the number of optoelectronic components, such that each optoelectronic component includes one connection carrier with at least one optoelectronic semiconductor chip, one frame with at least one opening and at least one optical element.

18 Claims, 5 Drawing Sheets

(51) Int. Cl.
*F21V 5/00* (2015.01)
*F21Y 105/00* (2016.01)

(52) U.S. Cl.
CPC ........... *H01L2224/48091* (2013.01); *H01L 2224/73265* (2013.01); *H01L 2933/0058* (2013.01)

(56) References Cited

U.S. PATENT DOCUMENTS

| | | | | |
|---|---|---|---|---|
| 7,457,490 B2* | 11/2008 | Rudmann | ............ | H01L 25/167 257/E25.032 |
| 7,842,957 B2* | 11/2010 | Goh | ............ | H04B 10/40 250/221 |
| 8,449,128 B2* | 5/2013 | Ko et al. | ............ | 362/84 |
| 8,742,350 B2* | 6/2014 | Yao | ............ | G01S 7/4813 250/338.1 |
| 2003/0094891 A1* | 5/2003 | Green et al. | ............ | 313/495 |
| 2004/0208210 A1 | 10/2004 | Inoguchi | | |
| 2005/0074912 A1 | 4/2005 | Yamauchi et al. | | |
| 2006/0001055 A1 | 1/2006 | Ueno et al. | | |
| 2006/0078246 A1 | 4/2006 | Ashida | | |
| 2009/0001405 A1* | 1/2009 | Choi | ............ | 257/99 |
| 2010/0109021 A1 | 5/2010 | Horio | | |
| 2010/0207140 A1* | 8/2010 | Rudaz | ............ | H01L 33/486 257/98 |
| 2011/0024627 A1 | 2/2011 | Yao | | |
| 2011/0215342 A1* | 9/2011 | Oliver | ............ | 257/81 |
| 2012/0068615 A1* | 3/2012 | Duong et al. | ............ | 315/192 |
| 2012/0314393 A1* | 12/2012 | Leib et al. | ............ | 361/809 |
| 2013/0019461 A1* | 1/2013 | Rudmann et al. | ............ | 29/592.1 |
| 2013/0037831 A1* | 2/2013 | Rudmann et al. | ............ | 257/88 |
| 2014/0084307 A1* | 3/2014 | Halbritter | ............ | 257/82 |
| 2014/0191253 A1* | 7/2014 | Haslbeck et al. | ............ | 257/82 |
| 2014/0247578 A1* | 9/2014 | Chen | ............ | H01L 25/0753 362/84 |
| 2014/0361200 A1* | 12/2014 | Rudmann | ............ | H01L 25/167 250/578.1 |

FOREIGN PATENT DOCUMENTS

| | | |
|---|---|---|
| CN | 103512595 A | 1/2014 |
| DE | 160263 A1 | 5/1983 |
| EP | 2196724 A2 | 6/2010 |
| JP | 0385749 A | 4/1991 |
| JP | 2004294980 A | 10/2004 |
| JP | 2008300553 A1 | 12/2008 |
| TW | 200613123 A | 5/2006 |
| WO | 2011022610 A1 | 2/2011 |

* cited by examiner

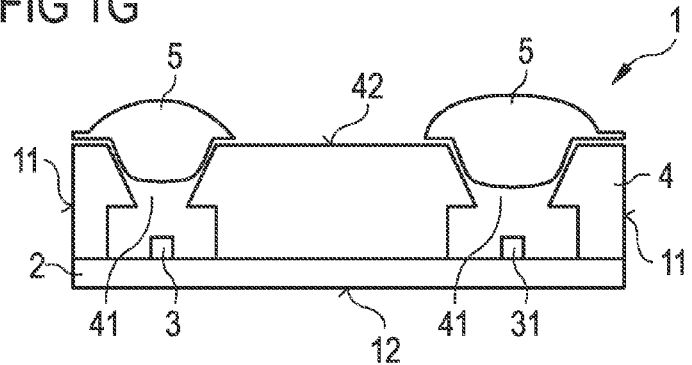
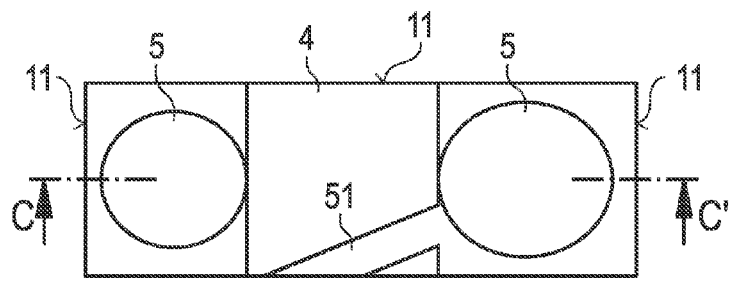
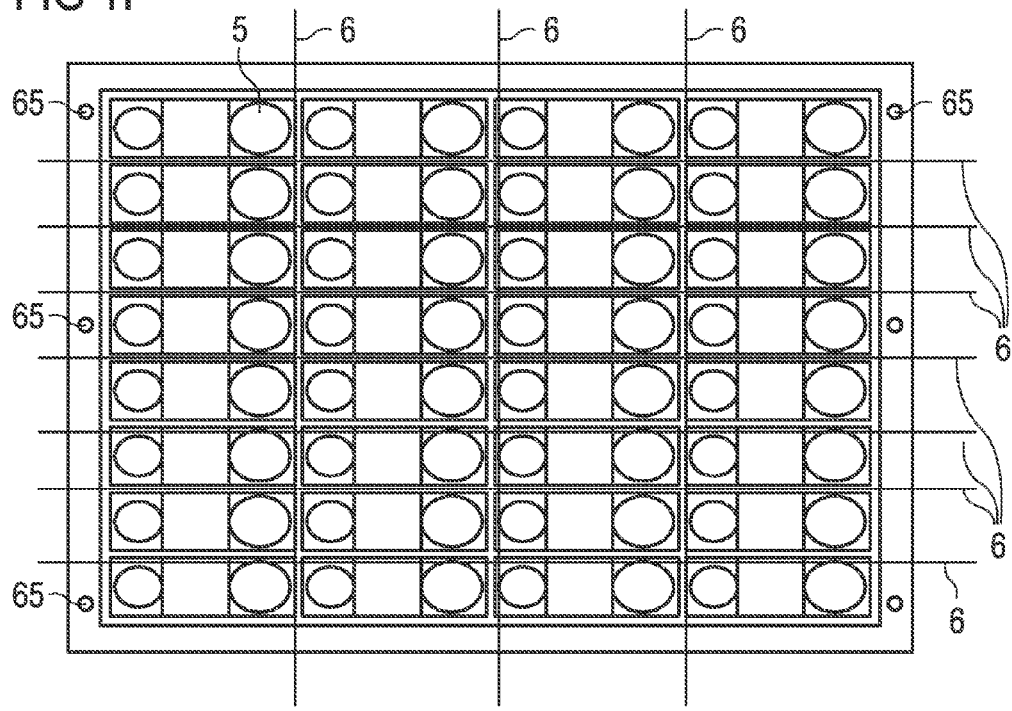

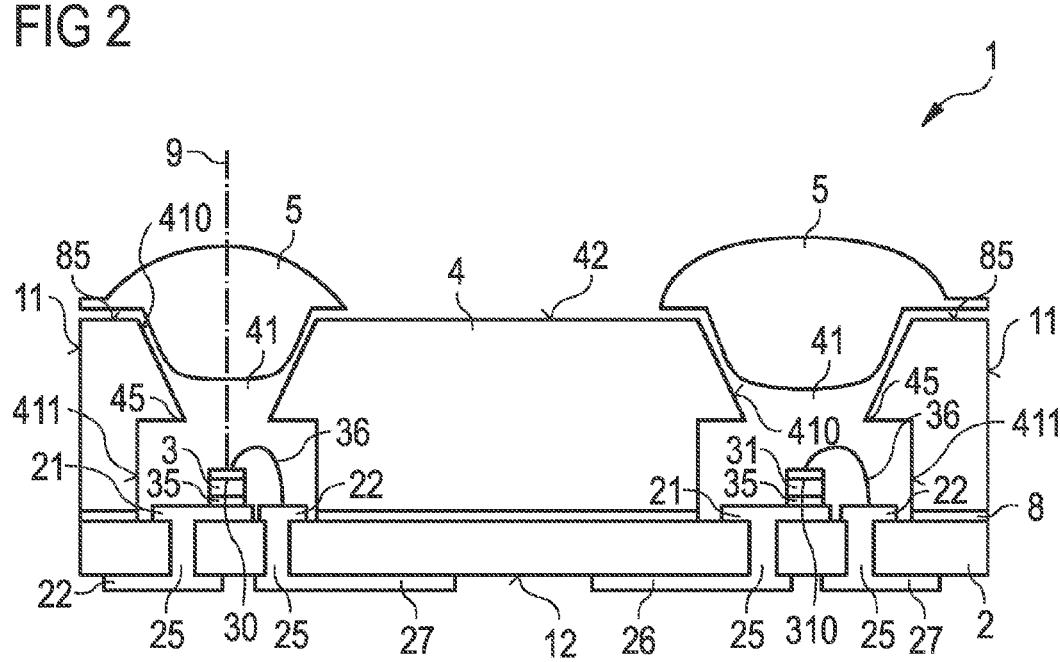

METHOD FOR PRODUCING A PLURALITY OF OPTO-ELECTRONIC COMPONENTS AND OPTO-ELECTRONIC COMPONENT

This patent application is a national phase filing under section 371 of PCT/EP2012/064886, filed Jul. 30, 2012, which claims the priority of German patent application 10 2011 113 483.6, filed Sep. 13, 2011, each of which is incorporated herein by reference in its entirety.

TECHNICAL FIELD

The present application relates to a method for producing a plurality of optoelectronic components and to an optoelectronic component.

BACKGROUND

Combining optical elements such as, for example, lenses and optoelectronic components such as, for example, semiconductor chips often requires a comparatively complicated production process.

SUMMARY OF THE INVENTION

Embodiments of the invention provide a production method with which a plurality of optoelectronic components, each with at least one optical element, may be produced simply and reliably. Embodiments also provide an optoelectronic component that is reliable and relatively simple to produce and is distinguished by good optoelectronic properties.

In one embodiment, in a method for producing a plurality of optoelectronic components a connection carrier assembly is provided. A plurality of semiconductor chips are arranged on the connection carrier assembly. A frame assembly with a plurality of openings is positioned in such a way relative to the connection carrier assembly that the semiconductor chips are each arranged in one of the openings. A plurality of optical elements are positioned in such a way relative to the frame assembly that the optical elements cover the openings. The connection carrier assembly with the frame assembly and the optics assembly is singulated into the plurality of optoelectronic components, such that each optoelectronic component comprises one a connection carrier with at least one optoelectronic semiconductor chip, one frame with at least one opening and at least one optical element.

The optical elements are preferably provided in an optics assembly. The optical elements may in particular be positioned as a contiguous optics assembly, such that an optical element can be assigned simultaneously to a plurality of semiconductor chips.

The method does not necessarily have to proceed in the order listed above. For example, the optical elements, in particular in the form of an optics assembly, may be positioned relative to the frame assembly, and moreover attached thereto, before the frame assembly is positioned relative to the connection carrier assembly. Furthermore, positioning of the frame assembly relative to the connection carrier assembly may take place before the plurality of semiconductor chips are arranged on the connection carrier assembly.

The optics assembly may be singulated on singulation into optoelectronic components. On singulation of the connection carrier assembly into the plurality of optoelectronic components, the optics assembly, the connection carrier assembly and the frame assembly are preferably severed in a common singulation step. Severing may, for example, proceed mechanically, for instance, by means of sawing.

The method is suitable for producing optoelectronic components with one or more semiconductor chip. The component may moreover comprise one or more openings. Precisely one semiconductor chip may be assigned to each opening. However, more than one semiconductor chip may also be arranged in an opening.

In a preferred configuration, at least two optical elements are connected together in the optics assembly by means of a web. A web is generally understood to mean a connection element between two optical elements which serves substantially to join the optical elements together mechanically and in particular does not itself fulfil any optical function. In particular, in plan view onto the optics assembly the web may have a smaller extent at least in a lateral direction, i.e., in a direction extending in a main plane of extension of the optics assembly, than one of the optical elements.

The web is preferably severed on singulation of the optics assembly. In the finished component the web thus terminates flush with a side face defining the optoelectronic component in the lateral direction.

In a further preferred configuration, the optoelectronic components each comprise at least two optical elements, wherein the optics assembly is preferably severed in such a way that the optical elements of a component are each completely separated from one another. Completely separated from one another means in this context that the optical elements of one component are formed as separate elements, which moreover are preferably spaced laterally from one another. Optical crosstalk, caused by a contiguous connection between two adjacent optical elements of a component, can in this way be avoided or at least reduced.

In a preferred configuration, the optical elements project into the openings in the frame assembly on positioning of the optics assembly. Preferably, the optical elements on the side facing the frame assembly and the openings in the frame assembly are adapted to one another such that the optical elements position themselves in a predetermined manner, in particular center themselves, relative to the openings on introduction into the openings. The optical elements thus undergo self-adjustment relative to the openings in the frame assembly. An optical axis of the optical elements in this case extends, in plan view onto the component, preferably through the center point or substantially through the center point of the openings.

It is thus simply ensured that the optical elements may be arranged reliably in a position defined precisely relative to the frame assembly and subsequently attached.

Moreover, a cross-section of a part of the optical element projecting into the opening may decrease in the direction of the connection carrier. In this way, orientation of the optical element relative to the frame may be made self-adjusting in a simplified manner.

According to one embodiment, an optoelectronic component comprises a connection carrier to which at least one optoelectronic semiconductor chip is attached. A frame is arranged on the connection carrier. The frame comprises an opening which extends from a major face remote from the connection carrier towards the connection carrier and in which the semiconductor chip is arranged. An optical element is arranged on the frame, which element in particular completely covers the opening.

The optical element preferably bounds the component on the side of the frame remote from the connection carrier. The optical element may thus serve in beam guidance and at the same time to protect the semiconductor chip, for example, from mechanical stress.

In a preferred configuration the optical element extends at least in places as far as a side face defining the optoelectronic component in a lateral direction. The optical element thus terminates flush with the side face of the optoelectronic component. On production, the optical element may thus be obtained in simplified manner on singulation of the optoelectronic components from an optics assembly with a plurality of contiguous optical elements.

The connection carrier and frame also preferably terminate flush with one another at least in a lateral direction, preferably around the entire circumference.

The optoelectronic component is also preferably configured as a surface-mountable component (surface mount device, SMD). The connection carrier preferably bounds the optoelectronic component on the opposite side from the optical element. The frame is thus provided on just one side of the connection carrier. External electrical contacting may take place on the side of the connection carrier remote from the semiconductor chip.

The connection carrier may, for example, take the form of a circuit board, for instance a printed circuit board (PCB).

In a further preferred configuration, a beam path between the optical element and the semiconductor chip is configured to be free of an enclosure surrounding the semiconductor chip. The beam path thus comprises an optical free space zone between the element and the semiconductor chip. The optical element covers the semiconductor chip in plan view onto the optoelectronic component and thus protects the semiconductor chip from external influences such as mechanical stress, moisture or dust. It is therefore possible to dispense with a semiconductor chip enclosure acting as encapsulation.

In a further preferred configuration, the opening tapers at least in places from the major face of the frame towards the connection carrier. Centering of the optical element relative to the opening in the frame during production of the optoelectronic component is thereby simplified.

In a further preferred configuration, the opening comprises an undercut. The space available in the opening for mounting the semiconductor chip may thus be increased while retaining the same aperture.

In a further preferred configuration, the semiconductor chip is provided to generate radiation. Furthermore, the component preferably comprises a further semiconductor chip which is intended to receive radiation. The semiconductor chips are in each case arranged in one opening in the frame. The semiconductor chips are thus separated from one another optically by means of the frame. The optoelectronic component may, for example, take the form of a proximity sensor, in which the further semiconductor chip detects the radiation generated by the semiconductor chip and reflected back at a target object outside the component.

In a preferred further development, an optical decoupling element is provided on the major face of the frame between the openings. The optical decoupling element is intended to reduce optical crosstalk between the semiconductor chip and the further semiconductor chip. The optical decoupling element may take the form of a separating web, which extends vertically from the major face of the frame away from the connection carrier. The separating web may in particular be in one piece with the frame. In the lateral direction a main direction of extension of the web preferably extends transversely of or perpendicular to a connecting line between the semiconductor chip and the further semiconductor chip.

Alternatively or in addition, the major face of the frame may be covered with an absorbing material. In particular, the absorbing material may cover the exposed part of the major face of the frame, i.e., the part of the major face not covered by the optical element or optical elements.

The optical element preferably projects into the opening. The thickness, i.e., the extent of the optical element along its optical axis, may in this way be increased without increasing the vertical extent of the component.

In a further preferred configuration, the optical element is convexly curved on the side facing the semiconductor chip.

In a preferred further development, a maximum height of the optical element is at least 0.2 times the maximum cross-sectional extent of the opening, preferably at least 0.5 times the maximum cross-sectional extent of the opening. In particular, the part of the optical element projecting into the opening may have a spherical basic shape at least in places.

The method described further above is particularly suitable for producing the above-described optoelectronic component. Features listed in connection with the method may therefore also be used for the optoelectronic component and vice versa.

BRIEF DESCRIPTION OF THE DRAWINGS

Further features, configurations and convenient aspects are revealed by the following description of the exemplary embodiments in conjunction with the figures, in which:

FIGS. 1A to 1I show an exemplary embodiment of a method for producing a plurality of optoelectronic components by means of schematically illustrated intermediate steps shown in section (FIGS. 1A, 1B, 1D, 1F, 1G) and in plan view (FIG. 1C, 1E, 1H, 1I); and FIGS. 2 to 4 each show an exemplary embodiment of an optoelectronic component in schematic sectional view.

Identical, similar or identically acting elements are provided with the same reference numerals in the figures.

The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1A:
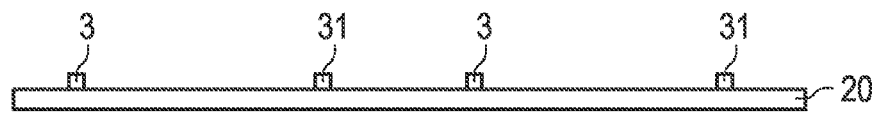

FIGS. 1A to 1I are schematic representations of an exemplary embodiment of a method for producing a plurality of optoelectronic components. The method is described by way of example with reference to the production of optoelectronic components with in each case one semiconductor chip 3 and one further semiconductor chip 31. As shown in FIG. 1A, the semiconductor chips 3, 31 are arranged on a connection carrier assembly 20 and attached thereto. Details relating to the production of a mechanical and electrical connection between the semiconductor chips and the connection carrier assembly are not shown in FIG. 1A for simplicity's sake and are explained in greater detail in relation to FIG. 2.

The connection carrier assembly 20 may, for example, take the form of a circuit board, in particular a printed circuit board (PCB) or a printed circuit board with metal core (metal core printed circuit board (MCPCB).

Figure 1B:
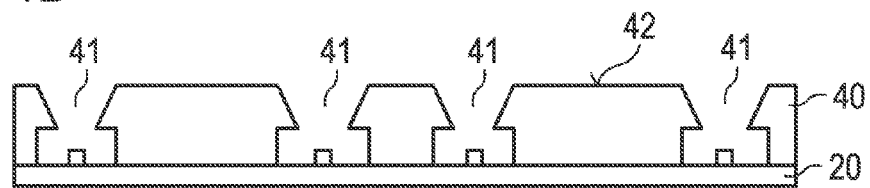

As shown in FIG. 1B, a frame assembly 40 with a plurality of openings 41 is arranged on the connection carrier assembly 20 and attached thereto, for example, by means of an attachment layer (not shown explicitly in FIG. 1B). The openings extend vertically completely through the frame assembly 40.

The frame assembly 40 may, for example, take the form of a plastics body. The frame assembly may, for example, be produced by an injection molding method or a transfer molding method. The frame assembly constitutes a pre-manufactured, continuous element.

Figure 1C:
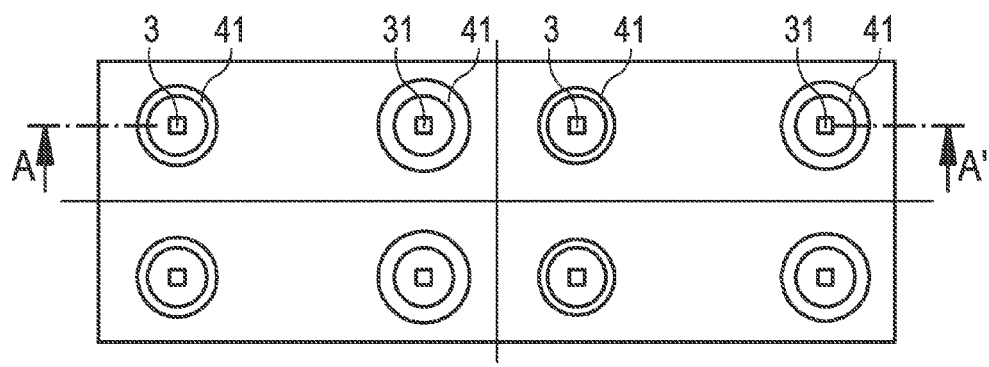

A portion of the frame assembly 40 is shown in schematic plan view in FIG. 1C, FIG. 1B representing an associated sectional view along line A-A'. On subsequent singulation into individual components, four frames 4 for four components 1 are obtained from the frame assembly 40 illustrated in FIG. 1C.

Figure 1D:
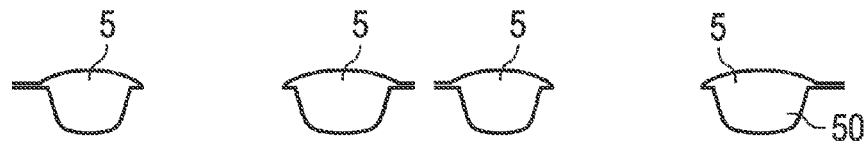
Figure 1E:
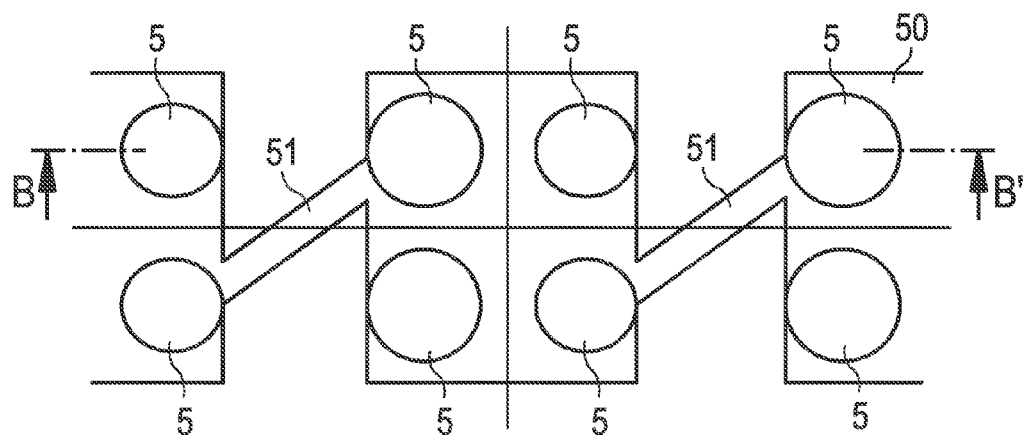

A portion of an optics assembly 50 is shown in FIG. 1E in schematic plan view and in FIG. 1D in associated sectional view along line B-B'. The optics assembly 50 comprises a plurality of optical elements 5. For simplified simultaneous positioning of the optical elements, the optics assembly 50 preferably takes the form of a contiguous assembly. The optical elements are thus provided in pre-manufactured form. Consequently no method step is necessary in which the optical elements are formed in the openings 41 by means of a potting material.

The optical elements 5 preferably contain a transparent or at least translucent plastics material or consist of such a material. In the exemplary embodiment shown, the optical elements associated with the semiconductor chips 3 are different from the optical elements associated with the further semiconductor chips 31. Beam-shaping may thus be adjusted mutually independently for the semiconductor chips 3, 31. On the other hand, the optical elements may also be identical.

In the exemplary embodiment shown in FIG. 1E the optical elements 5 are partially joined together by way of webs 51. The optics assembly 50 is preferably formed in one piece with the webs 51 and the optical elements 5. Unlike the optical elements 5, the webs 51 in the finished component do not have to fulfil any optical function, but rather serve during production in particular to simplify the simultaneous positioning of a plurality of optical elements relative to the semiconductor chips 3, 31.

Figure 1F:
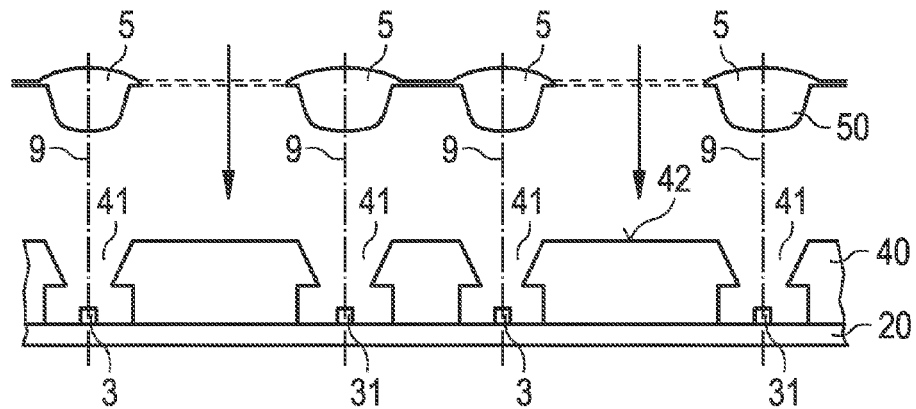

The optics assembly is positioned in such a way relative to the frame assembly 40 that an optical element 5 is assigned to each of the openings 41 (FIG. 1F). The optical elements are embodied such that they project partially into the openings 41. Furthermore, the optical elements 5 taper on the side facing the frame assembly 40.

The frame assembly 40 comprises a major face 42 remote from the connection carrier assembly 20. The openings 41 taper from the major face 42 towards the connection carrier assembly 20. This, in particular in conjunction with the tapering configuration of the optical elements, makes it simpler for the optical elements to be positioned, when the optics assembly 50 and the frame assembly 40 are joined together, in such a way that an optical axis 9 of the optical element 5 in each case extends centrally relative to the opening 41. In addition, the optical axis 9 preferably extends in each case through the semiconductor chip 3 or the further semiconductor chip 31.

Unlike in the described exemplary embodiment, the optics assembly 50 may also be positioned relative to the frame assembly 40 and moreover be attached thereto, before the frame assembly is attached to the connection carrier assembly 20.

It is moreover also feasible to arrange the frame assembly 40 on the connection carrier assembly 20 before the semiconductor chips 3, 31 are attached to the connection carrier assembly.

Once the connection carrier assembly 20, frame assembly 40 and optics assembly 50 have been joined together, they are singulated into a plurality of optoelectronic components.

A singulated component is shown in schematic plan view in FIG. 1H and in FIG. 1G in associated sectional view along the line C-C'.

The finished component comprises a connection carrier 2 as part of the connection carrier assembly 20 and a frame 4 as part of the frame assembly 40. In a lateral direction the component 1 is defined by a side face 11, which arises on singulation. Singulation may proceed, for example, by a mechanical method, for example by sawing or by a laser separation method.

The connection carrier 2 and the frame 4 terminate flush with one another at the side face 11 over the entire circumference of the component 1. Moreover, at least part of the optics assembly 50, in the exemplary embodiment shown the optical elements 5 and web 51, extends as far as the side face 11.

The finished component thus comprises two optical elements, at least one of the optical elements being connected with the web 51, which terminates flush with a side face defining the optoelectronic component in the lateral direction.

The optical elements 5 of the component 1 are configured as separate elements in the finished component. There is thus no direct connection between these optical elements. The risk of optical crosstalk between the semiconductor chips 3, 31 is thus reduced.

Using the described method, a plurality of optoelectronic components can be simultaneously produced simply and reliably, the components already each having at least one optical element on singulation from the assembly.

Production may in particular proceed such that the connection carriers 2, the frames 4 and the optical elements 5 may each be provided in premanufactured form as assemblies and singulated in a common step.

The method is further distinguished by simple scalability for simultaneous production of a plurality of components, so simplifying mass production. In FIG. 1I, for example, an optics assembly 50 with a matrix-like arrangement of 64 optical elements 5 is shown in plan view. On singulation into components along the grid-like dividing lines 6, 32 components are obtained therefrom, each with two optical elements 5.

For simplified, reliable positioning of the optics assembly 50 relative to the frame assembly 40, positioning elements 65 are preferably provided. The positioning elements may, for example, each take the form of holes in which pins engage.

It goes without saying that components may also be produced with the above-described production method which comprise just one optical element 5 and/or just one semiconductor chip 3. Furthermore, more than one semiconductor chip may also be arranged in one opening 41.

An exemplary embodiment of an optical component is illustrated in schematic sectional view in FIG. 2.

FIG. 2 is a more detailed representation of the component illustrated in FIG. 1G. Features already described in connection with FIGS. 1A to 1I are therefore also applicable to this exemplary embodiment and are not described explicitly at this point.

In this exemplary embodiment the optoelectronic component 1 illustrated takes the form of a proximity sensor. The component comprises a semiconductor chip 3 with an active region 30 for generating radiation. Furthermore, the component comprises a further semiconductor chip 31 with a further active region 310, which is intended to detect radiation generated by the semiconductor chip 3 and reflected at a target object outside the component. The semiconductor chips 3, 31 are each arranged on a land 21 of the connection carrier 2 and connected electrically conductively therewith.

The semiconductor chips 3, 31 are each connected with the land 21 via a bonding layer 35, for example, a solder or an electrically conductive adhesive.

Moreover, the connection carrier in each case comprises a further land 22, which in the exemplary embodiment shown are each connected electrically conductively with the semiconductor chips 3, 31 via a connecting lead 36, for example, a bonding wire.

The connection carrier 2 furthermore comprises vias 25, by means of which the lands 21, 22 are connected electrically conductively respectively with a first external contact 26 or a second external contact 27 arranged on the mounting face 12 of the component 1. The optoelectronic component 1 thus takes the form of a surface-mountable component which is contactable on the rear, i.e., on the side of the mounting face 12 extending in the lateral direction of the component.

Contacting of the semiconductor chips 3, 31 and the configuration of the lands 21, 22 are described merely by way of example. Semiconductor chips may alternatively also be used which are configured with flip chip geometry, such that the semiconductor chip comprises two bottom contacts. The semiconductor chip may moreover also be arranged on a face of the connection carrier 2 which is not connected with an external electrical contact. Moreover, at least one of the external contacts 26, 27 may also serve as a common contact, for example, a common earth contact, for the semiconductor chip 3 and the further semiconductor chip 31.

The frame 4 is attached to the connection carrier 2 by means of an attachment layer 8, for example, an adhesive layer. Depending on the requirements relating to the emission or detection properties of the optoelectronic component 1, the frame, in particular an inner surface 410 of the opening 41, may be covered with an absorbing material, for example, a black material. In the case of a proximity sensor it is thus possible to reduce the risk of detection of undesired stray radiation, for example, due to the reflection of a cover arranged downstream of the optoelectronic component, such as a glass sheet.

Alternatively or in addition, the frame 4 may also be made from an absorbing material, for example, a black plastics material.

A circumferential aperture 45 is formed in each opening 41 which is spaced vertically from the connection carrier 2. The aperture 45 defines a radiation cone, in which radiation emitted by the semiconductor chip 3 exits from the component 1 directly, i.e., without reflection at the inner surface 410 of the opening 41, or from which radiation impinging from outside the component impinges directly on the further semiconductor chip 31.

The opening 41 tapers towards the connection carrier 2 between the major face 42 and the aperture 45. Due to the inclined configuration of the aperture, precise positioning of the optical elements 5 relative to the frame 4 during production is simplified. The frame 4 thus on the one hand defines the aperture for the semiconductor chips while at the same time assisting in simplified positioning of the optical elements.

Between the aperture 45 and the connection carrier 2 the opening 41 comprises an undercut 411. The undercut allows a surface available for mounting of the semiconductor chips 3, 31 to be adjusted independently of the cross-sectional area of the aperture 45.

The optical elements 5 are attached by means of a further attachment layer 85, for example, an adhesive layer, on the side of the frame 4 remote from the connection carrier 2. The optical elements 5 are convexly curved on the side facing the semiconductor chips 3, 31 and on the side remote from the semiconductor chips. A maximum height of the optical elements 5, in particular the thickness of the optical elements along the optical axis 9, preferably amounts to at least 0.2 times, particularly preferably at least 0.5 times the maximum cross-sectional extent of the opening 41. In particular, the optical elements 5 may have a spherical basic shape in places, in particular in the region of the optical axis. The configuration of the optical element may be varied within broad limits depending on the desired beam shaping. The optical element may, for example, also take the form of a Fresnel lens.

The semiconductor chips 3, 31 are free of any semiconductor chip-surrounding enclosure. The semiconductor chips are protected on the side remote from the connection carrier 2 by means of the optical elements 5 and an additional production step to form an enclosure may be omitted. Furthermore, the risk may in this way be avoided of the enclosure exerting mechanical stress on the connection between the semiconductor chip 3, 31 and the connection carrier 2 or of the enclosure impairing the optical properties of the component.

Applications are however also conceivable in which an enclosure is provided to encapsulate the semiconductor chip.

The further exemplary embodiment illustrated in FIG. 3 corresponds substantially to the exemplary embodiment described in connection with FIG. 2. Unlike in FIG. 2, an optical decoupling element in the form of an absorbing material 7 is formed on the major face 42 of the frame 4. The absorbing material 7 preferably absorbs at least 80%, particularly preferably at least 90%, of the incident radiation. Optical crosstalk between the semiconductor chips 3, 31 within the component 1 may in this way be largely avoided. The absorbing material is preferably applied to the regions of the major face 42 which are not covered by the optical elements 5.

Figure 3:
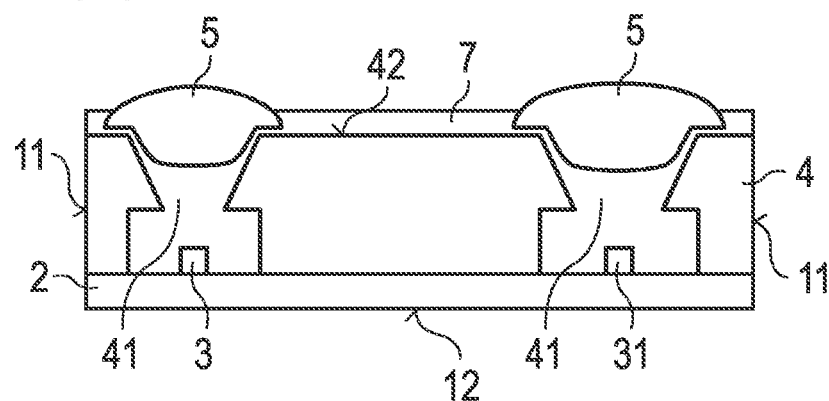
Figure 4:
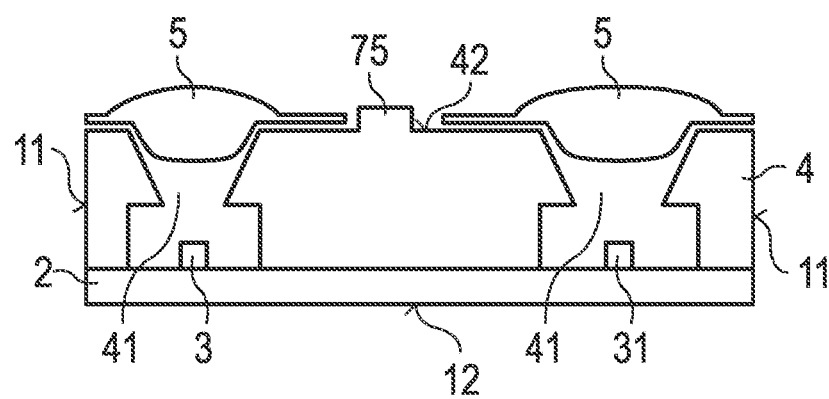

In contrast to the exemplary embodiment shown in FIG. 3, in the exemplary embodiment shown in FIG. 4 the optical decoupling element takes the form of a separating web 75. The separating web 75 preferably takes the form of an extension of the frame 4, which extends from the major face 42 away from the frame 4. In the lateral direction, a main direction of extension of the separating web 75 extends perpendicular to a connecting line between the semiconductor chip 3 and the further semiconductor chip 31. The separating web is preferably in one piece with the frame 4. In contrast thereto, the separating web may however also take the form of a separate, in particular premanufactured element, which is attached to the frame 4.

The semiconductor chip 3 provided for generating radiation, in particular the active region 30, is preferably based on a III-V compound semiconductor material. Preferably the semiconductor chip is provided to generate near infrared radiation, for example, with a peak wavelength of between 700 nm and 1.5 µm inclusive.

The further semiconductor chip 31 may in particular be based on silicon. The further semiconductor chip 31 may, for example, take the form of a photodiode, a phototransistor or an application-specific integrated circuit (ASIC) with a light-sensitive region.

The component 1 may moreover also comprise more than one radiation receiver, the radiation receiver preferably being provided to receive radiation in different spectral ranges. A further radiation receiver may, for example, take the form of an ambient light sensor. The further radiation receiver may be integrated into the further semiconductor chip 31 or take the form of a separate semiconductor chip.

Due to integration of an optical element, the optoelectronic component described is distinguished by good optoelectronic properties with a simultaneously compact structure. Positioning of the optical elements during production may proceed, in particular by means of self-adjustment, with high adjustment precision simultaneously for a plurality of components, so reducing manufacturing costs.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A method for producing a plurality of optoelectronic components, the method comprising:
   providing a connection carrier assembly;
   arranging a plurality of semiconductor chips on the connection carrier assembly;
   positioning a frame assembly with a plurality of openings such that, relative to the connection carrier assembly, each semiconductor chip is arranged in one of the openings;
   providing a plurality of optical elements in a contiguous optics assembly, the optics assembly comprising a translucent or transparent material, and positioning the plurality of optical elements such that, relative to the frame assembly, the optical elements cover the openings; and
   singulating the connection carrier assembly with the frame assembly and the optical elements into the plurality of optoelectronic components, such that each optoelectronic component comprises one connection carrier with an optoelectronic semiconductor chip, one frame with an opening, a first optical element and a second optical element, spaced apart from each other in a plan view of the components, wherein the singulating comprises severing the optics assembly, the connection carrier assembly and frame assembly in a common singulation step in such a way that the first optical element and the second optical element of each component are each separated completely from one another.

2. The method according to claim 1, wherein at least two optical elements are connected together in the optics assembly by a web.

3. The method according to claim 1, wherein the optical elements project into the openings after being positioned.

4. The method according to claim 1, wherein the singulating comprises sawing.

5. The method according to claim 1, wherein the first optical element extends at least in places as far as a side face defining the optoelectronic component in a lateral direction and wherein first optical element projects into the opening.

6. The method according to claim 1, wherein the semiconductor chip is configured to generate radiation, the method further comprising arranging a further semiconductor chip that is configured to receive radiation in a further opening in the frame.

7. The method according to claim 6, further comprising forming an optical decoupling element on the major face of the frame between the opening and the further opening.

8. The method according to claim 1, wherein the first optical element and the second optical element are convexly curved on a side facing the semiconductor chip.

9. The method according to claim 1, wherein the frame assembly comprises a major face remote from the connection carrier assembly, and wherein the first optical element and the second optical element are spaced apart from each other in a direction running parallel to the major face of the frame assembly.

10. An optoelectronic component comprising:
    a connection carrier;
    a first optoelectronic semiconductor chip and a second optoelectronic semiconductor chip attached to the connection carrier;
    a frame arranged on the connection carrier; the frame comprising a first opening and a second opening that extend from a major face remote from the connection carrier towards the connection carrier and in which the first semiconductor chip and the second semiconductor chip are arranged;
    a first optical element covering the first opening on the frame; and
    a second optical element covering the second opening on the frame and spaced apart from the first optical element in a plan view of the optoelectronic component, wherein at least one of the first optical element and the second optical element is connected with a web and formed in one piece with the web, which terminates flush with a side face defining the optoelectronic component in a lateral direction;
    wherein the first optical element, the second optical element, and the web comprise a translucent or transparent material.

11. The optoelectronic component according to claim 10, wherein the first optical element extends at least in places as far as a side face defining the optoelectronic component in a lateral direction.

12. The optoelectronic component according to claim 10, wherein the first and second optical elements each project into the first opening and the second opening respectively.

13. The optoelectronic component according to claim 10, wherein a beam path between the first optical element and the first semiconductor chip is configured to be free of an enclosure surrounding the first semiconductor chip.

14. The optoelectronic component according to claim 10, wherein each opening tapers at least in places from the major face of the frame towards the connection carrier.

15. The optoelectronic component according to claim 10, wherein the first semiconductor chip is configured to generate radiation and the second semiconductor chip is configured to receive radiation.

16. The optoelectronic component according to claim 15, further comprising an optical decoupling element formed on the major face of the frame between the first opening and the second opening.

17. The optoelectronic component according to claim 10, wherein the first optical element and the second optical element are convexly curved on a side facing the semiconductor chip.

18. The optoelectronic component according to claim 10, wherein the web terminates flush with exactly one side face defining the optoelectronic component in lateral direction.

\* \* \* \* \*